（12) United States Patent
Xu et al.

(10) Patent No.: US 7,965,157 B2
(45) Date of Patent: Jun. 21, 2011

(54) CANCELLATION OF ANTI-RESONANCE IN RESONATORS

(75) Inventors: Yong Ping Xu, Singapore (SG); Rui Yu, Singapore (SG)

(73) Assignee: National University of Singapore, Singapore (SG)

( * ) Notice: Subject to any disclaimer, the term of this patent is extended or adjusted under 35 U.S.C. 154(b) by 294 days.

(21) Appl. No.: 11/996,252

(22) PCT Filed: Jul. 20, 2005

(86) PCT No.: PCT/SG2005/000245
§ 371 (c)(1),
(2), (4) Date: Jan. 18, 2008

(87) PCT Pub. No.: WO2007/011307
PCT Pub. Date: Jan. 25, 2007

(65) Prior Publication Data
US 2008/0197943 A1    Aug. 21, 2008

(51) Int. Cl.
*H03H 9/02* (2006.01)
*H03H 9/54* (2006.01)
*H03H 9/64* (2006.01)
*H03M 3/02* (2006.01)
*H04B 14/06* (2006.01)

(52) U.S. Cl. ........ 333/187; 333/193; 341/143; 375/247; 375/252

(58) Field of Classification Search .......... 333/186–189, 333/193–196; 341/126, 143, 155, 200; 375/151, 375/153, 245, 247, 248, 252, 316, 324
See application file for complete search history.

(56) References Cited

U.S. PATENT DOCUMENTS

| 2,054,757 A | | 9/1936 | Lamb | |
|---|---|---|---|---|
| 2,207,691 A | | 7/1940 | Crosby | |
| 3,582,827 A | | 6/1971 | Bjerede | |
| 3,582,837 A | * | 6/1971 | DeVries | 333/193 |
| 3,731,230 A | * | 5/1973 | Cerny, Jr. | 331/116 R |
| 3,875,533 A | * | 4/1975 | Irwin et al. | 331/116 R |

(Continued)

FOREIGN PATENT DOCUMENTS

DE    1257995 B1    1/1968

(Continued)

OTHER PUBLICATIONS

Rausch, et al., "A One Tube Crystal Filter Reference Generator for Color TV Receivers", IRE Transactions on Broadcast and Television Receivers, IEEE, USA, vol. BTR-1, No. 1, Jun. 1, 1957, pp. 2-7.
Xu, et al., "A Prototype Bandpass Sigma-Delta Modulator Employing Crystal Resonator", Analog Integrated Circuits and Signal Processing, Kluwer Academic Publishers, BO, vol. 44, No. 3, Sep. 1, 2005, pp. 261-269.

(Continued)

*Primary Examiner* — Barbara Summons
(74) *Attorney, Agent, or Firm* — Schwabe, Williamson & Wyatt, P.C.

(57) ABSTRACT

Briefly, in accordance with one embodiment of the invention, a resonator such as an electromechanical resonator may be coupled with a cancellation network to reduce and/or cancel an anti-resonance effect in the resonator, which may be due to, for example, a static capacitance inherent in the resonator. Cancellation of an anti resonance effect from the resonator response may allow a resonance effect of the resonator to be a predominant effect to allow the resonator to be utilized as a bandpass filter having a relatively higher Q, for example in a bandpass sigma-delta modulator that may be utilized in a digital RF receiver.

44 Claims, 6 Drawing Sheets

U.S. PATENT DOCUMENTS

| | | | |
|---|---|---|---|
| 4,158,787 A * | 6/1979 | Forward | 310/51 |
| 4,577,168 A | 3/1986 | Hartmann | |
| 5,027,120 A * | 6/1991 | Thurston | 341/143 |
| 5,047,734 A * | 9/1991 | Newell et al. | 331/46 |
| 5,933,062 A | 8/1999 | Kommrusch | |
| 6,292,121 B1 | 9/2001 | Cake | |
| 6,462,687 B1 * | 10/2002 | Eshraghi et al. | 341/143 |
| 6,639,946 B2 * | 10/2003 | Wu et al. | 375/247 |
| 6,931,241 B2 * | 8/2005 | Khlat et al. | 455/137 |
| 7,346,134 B2 * | 3/2008 | Smith | 375/346 |
| 7,514,759 B1 * | 4/2009 | Mehta et al. | 257/416 |
| 7,804,374 B1 * | 9/2010 | Brown et al. | 331/116 R |
| 2003/0090399 A1 | 5/2003 | Xu | |
| 2003/0148733 A1 | 8/2003 | Xu | |
| 2005/0118977 A1 | 6/2005 | Drogi | |

FOREIGN PATENT DOCUMENTS

| | | | |
|---|---|---|---|
| JP | 4-134913 | * | 5/1992 |
| JP | 2001-217649 | * | 8/2001 |
| KR | 10-1999-0013519 | | 2/1999 |
| KR | 2000-0035813 | | 6/2000 |
| KR | 2001-32840 | * | 4/2001 |
| KR | 10-2004-0066119 | | 7/2004 |
| KR | 100712412 B1 | | 4/2007 |
| WO | 03043198 | | 5/2003 |

OTHER PUBLICATIONS

Supplementary Search Report for EP 05766729, dated Oct. 9, 2008.
International Search Report and Written Opinion for Application PCT/SG05/000245, dated May 30, 2006.
International Preliminary Report on Patentability for Application, PCT/SG05/000245, dated Jan. 22, 2008.
Office Action for Application, CN 200580051116.7, dated Jul. 3, 2009.
Office Action for Application, EP 05766729.7, dated Feb. 6, 2009.
Office Action for Application, EP 05766729.7, dated Sep. 22, 2009.
Summons to Attend Oral Proceedings for Application, EP 05766729.7, dated Oct. 7, 2010.
Office Action for Application, KR 10-2008-7003017, dated Nov. 1, 2010.
EPO Communication of First Examiner for EP Application 05766729.7, mailed Jan. 19, 2011, 4 pages.
Decision to Refuse a European Patent Application for EP Application 05766729.7, mailed on Feb. 3, 2011. 10 pages.
Office Action for Application No. JP 2008-522742, issued on Apr. 5, 2011.

* cited by examiner

CANCELLATION OF ANTI-RESONANCE IN RESONATORS

TECHNICAL FIELD

Subject matter herein generally may relate to digital communication (Class 375), and particularly may relate to reduction and/or cancellation of anti-resonance in resonators that may be utilized in sigma-delta modulators, although the scope of the claimed subject matter is not limited in this respect. In one or more particular embodiments, subject matter herein may relate to delta modulation (Subclass 247), although the scope of the claimed subject matter is not limited in this respect.

BACKGROUND

Communication systems have widely used surface acoustic wave (SAW) resonators due to their higher quality (Q) factors which typically are difficult to achieve with active filters. Recent developments in micro-mechanical resonators have allowed micro-mechanical resonators to replace SAW resonators since such micro-mechanical resonators tend to be less bulky than SAW resonators. However, micro-mechanical resonators often have limited resonant frequencies, typically on the order of hundreds of megahertz (MHz). Advances in bulk acoustic wave (BAW) resonator technology have allowed such BAW resonators to be utilized with conventional CMOS technology, and furthermore such BAW resonators have higher resonant frequencies typically in the gigahertz (GHz) range, allowing BAW resonators to be utilized in cellular and wireless local area network (WLAN) applications. Such resonators may exhibit both resonance characteristics and anti-resonance characteristics, where the resonance characteristic may provide a bandpass filter type function, and where the anti-resonance characteristic may provide a notch filter type function.

DESCRIPTION OF THE DRAWING FIGURES

Claimed subject matter is particularly pointed out and distinctly claimed in the concluding portion of the specification. However, both as to organization and/or method of operation, together with objects, features, and/or advantages thereof, may best be understood by reference to the following detailed description when read with the accompanying drawings in which:

Figure 8:
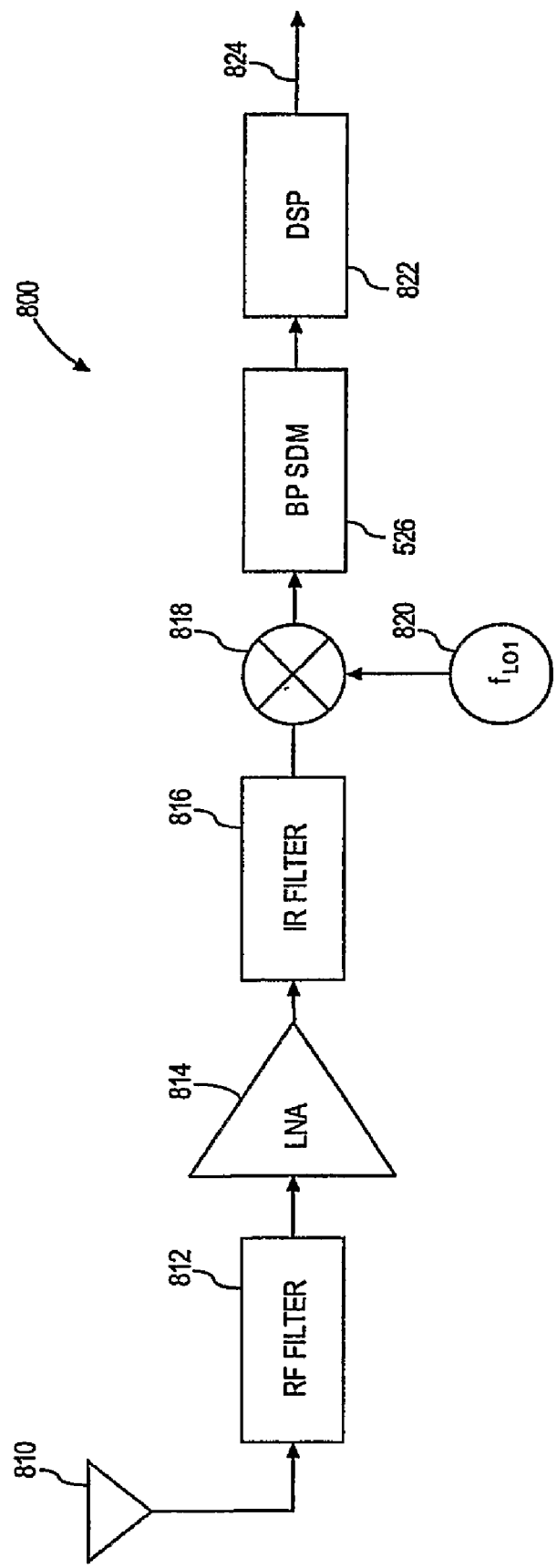
Figure 9:
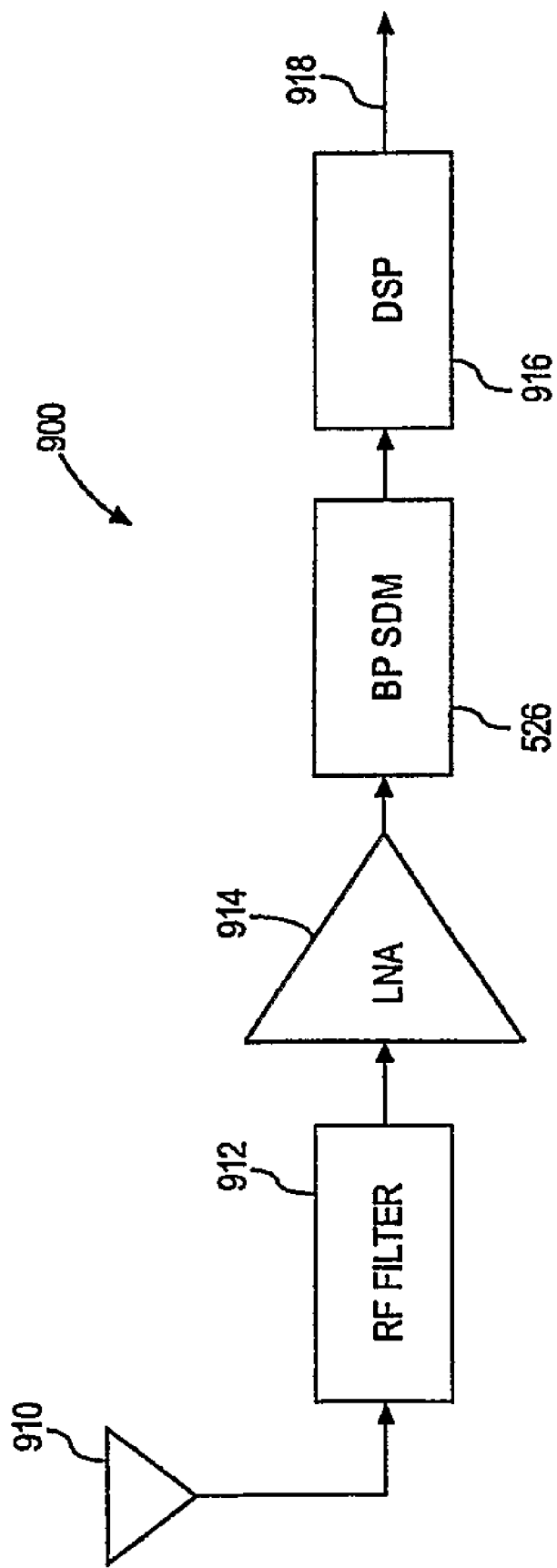

FIG. 8 is a block diagram of an intermediate-frequency (IF) digitization receiver for intermediate-frequency (IF) digitization including a wideband bandpass sigma-delta modulator that may utilize a resonator and a cancellation network in accordance with one or more embodiments; and FIG. 9 is a block diagram of a radio-frequency (RF) digitization receiver including an RF wideband bandpass sigma-delta modulator that may utilize a resonator and cancellation network in accordance with one or more embodiments.

It will be appreciated that for simplicity and/or clarity of illustration, elements illustrated in the figures have not necessarily been drawn to scale. For example, the dimensions of some of the elements may be exaggerated relative to other elements for clarity. Further, if considered appropriate, reference numerals have been repeated among the figures to indicate corresponding or analogous elements.

DETAILED DESCRIPTION

In the following detailed description, numerous specific details are set forth to provide a thorough understanding of claimed subject matter. However, it will be understood by those skilled in the art that claimed subject matter may be practiced without these specific details. In other instances, well-known methods, procedures, components and/or circuits have not been described in detail.

In the following description and/or claims, the terms coupled and/or connected, along with their derivatives, may be used. In particular embodiments, connected may be used to indicate that two or more elements are in direct physical and/or electrical contact with each other. Coupled may mean that two or more elements are in direct physical and/or electrical contact. However, coupled may also mean that two or more elements may not be in direct contact with each other, but yet may still cooperate and/or interact with each other.

It should be understood that certain embodiments may be used in a variety of applications. Although the claimed subject matter is not limited in this respect, the circuits disclosed herein may be used in many apparatuses such as in the transmitters and/or receivers of a radio system. Radio systems intended to be included within the scope of the claimed subject matter may include, by way of example only, wireless personal area networks (WPAN) such as a network in compliance with the WiMedia Alliance, wireless local area networks (WLAN) devices and/or wireless wide area network (WWAN) devices including wireless network interface devices and/or network interface cards (NICs), base stations, access points (APs), gateways, bridges, hubs, cellular radiotelephone communication systems, satellite communication systems, two-way radio communication systems, one-way pagers, two-way pagers, personal communication systems (PCS), personal computers (PCs), personal digital assistants (PDAs), and/or the like, although the scope of the claimed subject matter is not limited in this respect.

Types of wireless communication systems intended to be within the scope of the claimed subject matter may include, although are not limited to, Wireless Local Area Network (WLAN), Wireless Wide Area Network (WWAN), Code Division Multiple Access (CDMA) cellular radiotelephone communication systems, Global System for Mobile Communications (GSM) cellular radiotelephone systems, North American Digital Cellular (NADC) cellular radiotelephone systems, Time Division Multiple Access (TDMA) systems, Extended-TDMA (E-TDMA) cellular radiotelephone systems, third generation (3G) systems like Wideband CDMA (WCDMA), CDMA-2000, Universal Mobile Telecommunications System (UMTS), and/or the like, although the scope of the claimed subject matter is not limited in this respect.

Figure 1:
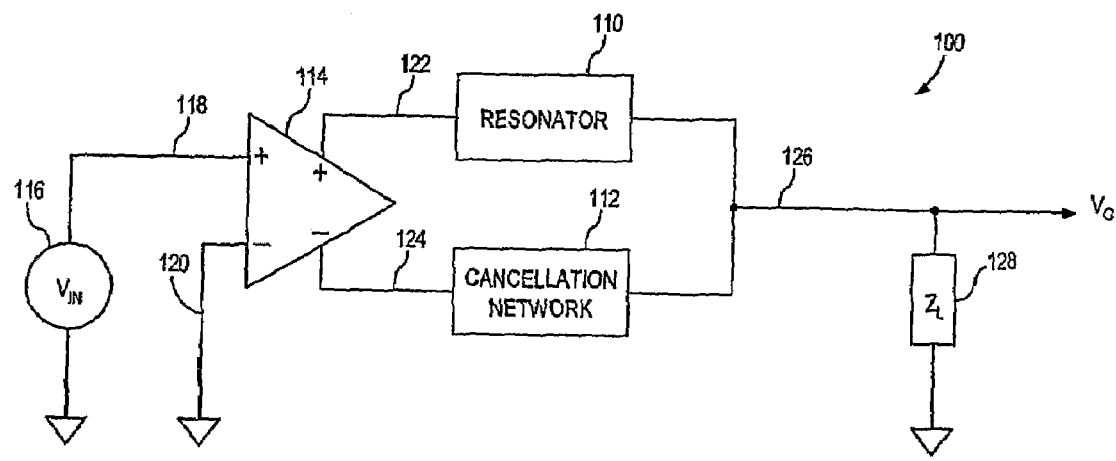
FIG. 1 is a circuit diagram of a resonator and cancellation network operable to implement a bandpass filter type function in accordance with one or more embodiments.
Figure 3:
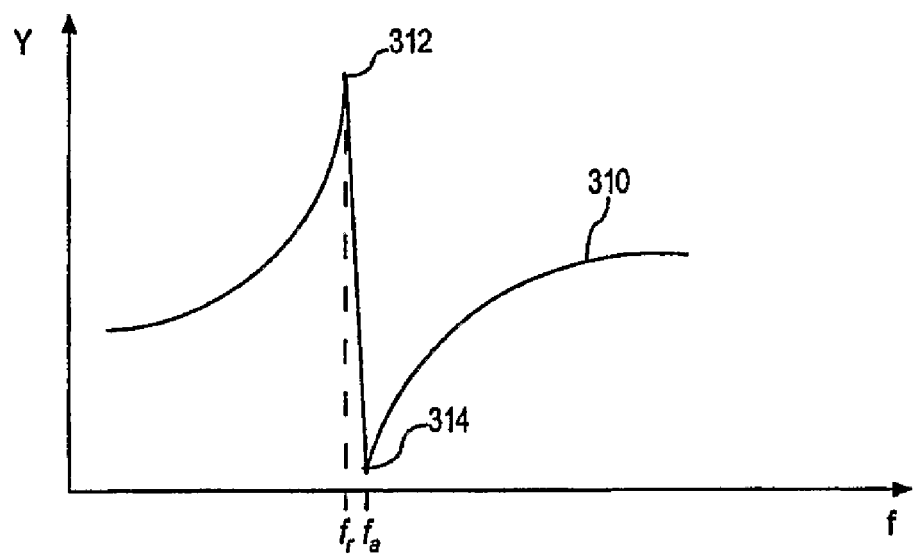
FIG. 3 is a diagram of a response of a resonator showing resonance and anti-resonance in accordance with one or more embodiments.

Referring now to FIG. 1, a diagram of a resonator and cancellation network in accordance with one or more embodiments will be discussed. As shown in FIG. 1, circuit 100 may include resonator 110 and cancellation network 112 in combination. The resonant frequency function of resonator 110 allows circuit 100 to function as a bandpass filter circuit with a relatively high Q factor. Typically, resonator 110 may exhibit two modes of resonance, a series mode of resonance and a parallel mode of resonance. In a series mode resonance, the impedance of resonator 110 may be at a minimum value, and/or admittance may be at a maximum value, which may occur at a frequency referred to as a resonant frequency. Likewise, in a parallel mode resonance, the impedance of resonator 110 may be at a maximum value, and/or admittance may be at a minimum value, which may occur at a frequency referred to as an anti-resonant frequency. An example of a response of resonator 110 exhibiting a resonance characteristic and an anti-resonance characteristic is shown in FIG. 3. For operation of circuit 100 as a bandpass filter, the resonant frequency characteristic may provide such a function. The anti-resonant frequency characteristic, however, in some applications, may be deleterious to the operation of resonator 110, for example where resonator 110 is utilized in a sigma-delta modulator such as sigma-delta modulator 526 shown, for example, in FIG. 6 where circuit 100 may function as a bandpass filter, although the scope of the claimed subject matter is not limited in this respect.

In one or more embodiments, resonator 110 may be realized as an electromechanical resonator. For example, resonator 110 may be a micro-electromechanical system (MEMS) type resonator, a crystal type resonator, a ceramic type resonator, a surface acoustic wave (SAW) type resonator, a bulk acoustic wave (BAW) type resonator, a film bulk acoustic resonator (FBAR) type resonator, and so on. Such electromechanical type resonators may generally provide a higher Q factor, higher accuracy of resonant frequencies, and greater temperature stability. In one or more embodiments, resonator 110 may be realized on a silicon substrate, for example via a micromachining process. In one particular embodiment, resonator 110 may be realized on an integrated complementary metal oxide semiconductor (CMOS) type circuit, and/or bipolar CMOS (BiCMOS) type circuit, although the scope of the claimed subject matter is not limited in this respect.

Cancellation network 112 may be utilized in circuit 100 to cancel the anti-resonance of resonator 110, for example to provide a more idealized bandpass filter response. In accordance with one or more embodiments, amplifier 114 may receive an input 116 at non-inverting input 118, and inverting input 120 of amplifier 114 may be coupled to ground. Non-inverting output 122 of amplifier 114 may be coupled to resonator 110, and inverting output 124 of amplifier 114 may be coupled to cancellation network 112. The outputs of resonator 110 and cancellation network 112 may be coupled to node 126 wherein resonator 110 and cancellation network 112 may be presented with the same load $Z_L$ 128, and/or the same effective load, and share a common output $V_O$ across load 128 at node 126. It should be noted that the various connections shown in FIG. 1 are merely one arrangement of circuit 100, and other arrangements of the connections may be utilized. For example resonator 110 may be coupled to inverting output 124 and cancellation network may be coupled to non-inverting output 122, and the scope of the claimed subject matter is not limited in this respect.

Figure 2:
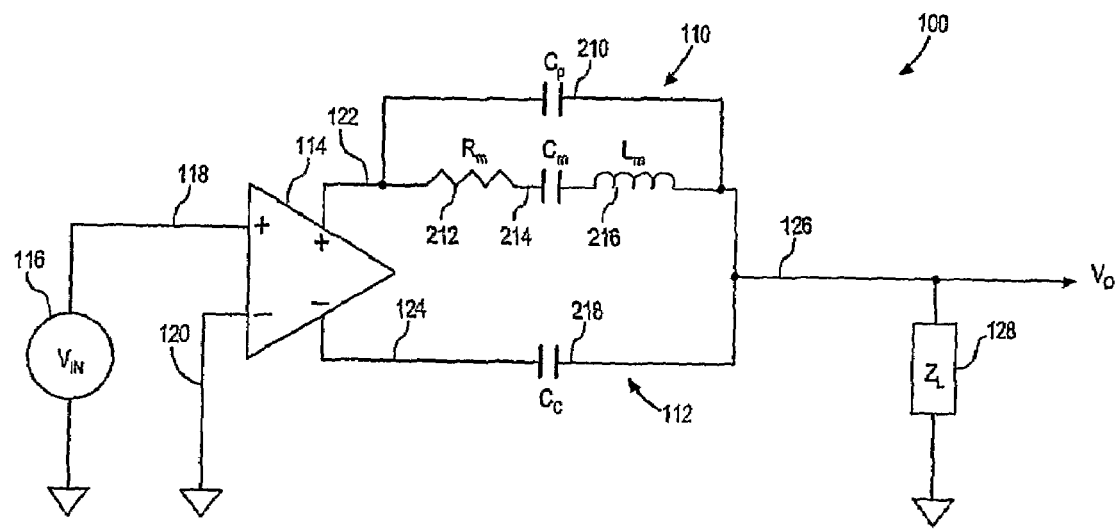
FIG. 2 is a diagram of an equivalent circuit for a resonator and a cancellation network in accordance with one or more embodiments.

Referring now to FIG. 2, a diagram of an equivalent circuit for a resonator and a cancellation network in accordance with one or more embodiments will be discussed. FIG. 2 shows circuit 100 of FIG. 2 where resonator 110 may be represented by equivalent circuit elements. The series mode resonance characteristic may be represented by a series RLC circuit comprising resistor $R_m$ 212, capacitor $C_m$ 214, and inductor $L_m$ 216, which may provide an ideal, and/or a somewhat ideal, transfer function for resonator 110. A parallel mode resonance characteristic may be represented by static capacitance $C_p$ 210 and $C_m$ 214. Static capacitance 210 may be an inherent characteristic of resonator 110, which may be modeled, for example, as a capacitance coupled in parallel with the RLC circuit comprising resistor 212, capacitor 214, and inductor 216. Static capacitance 210 may alter the ideal transfer function of resonator 110, for example by introducing two transmission zeroes into the transfer function of resonator 110. Cancellation capacitor $C_C$ 218 of cancellation network 112 may be utilized to reduce and/or eliminate the effects of static capacitance 210 of resonator 210, for example where resonator 110 may be utilized to provide a bandpass filter function in a sigma-delta modulator such as sigma-delta modulator 526 of FIG. 5 and FIG. 6, although the scope of claimed subject matter is not limited in this respect. For example, such an arrangement of circuit 100 using resonator 110 and cancellation network 112 may be utilized in circuits to emphasize the resonance characteristic of resonator 112 and to deemphasize the anti-resonance characteristic of resonator 112, although the scope of claimed subject matter is not limited in this respect.

Figure 4:
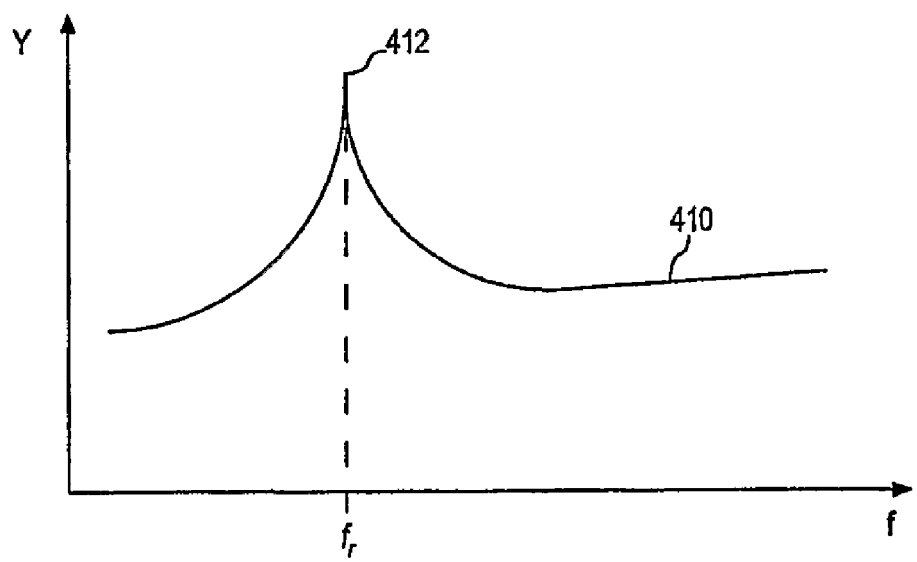
FIG. 4 is a diagram of a response of a resonator and a cancellation circuit showing a cancellation, at least in part, of anti-resonance in accordance with one or more embodiments.

When input signal 116 is applied to amplifier 114, current flowing through static capacitance 210 may be flowing in one direction and current flowing through cancellation capacitance may be flowing through cancellation capacitor 218 in an opposite direction due to the opposite phase polarities of non-inverting output 122 and inverting output 124 of amplifier 114. Since such currents are combined at node 126, such currents cancel out at load 128. As a result, the anti-resonance characteristic provided by static capacitance 210 may be reduced and/or eliminated, which may result in the series resonance effect of the RLC circuit as a predominant characteristic in the response of circuit 100, for example as shown in FIG. 4. Such a cancellation of the anti-resonance characteristic may occur, for example, where the value of cancellation capacitor 218 matches, or at least nearly matches, the value of static capacitance 210, although the scope of claimed subject matter is not limited in this respect. In such an arrangement, cancellation capacitor 218 may provide a negative capacitance with respect to the capacitance of static capacitance 210, wherein the cancellation capacitor 218 may effectively reduce and/or remove the response provided by static capacitance 210. It should be noted that, while in one embodiment cancellation network 112 may be realized by cancellation capacitor 218, any device and/or circuit element that is capable of presenting a negative capacitance with respect to static capacitance 218 may be utilized to realize cancellation network 112. For example, cancellation network 112 may comprise a diode having a capacitance matched or nearly matched to static capacitance 210 to cancel out, or at least partially cancel out, an anti-resonance characteristic provided by static capacitance 210, and the scope of the claimed subject matter is not limited in this respect. Thus, by matching cancellation capacitor 218 to static capacitance 210, cancellation of anti-resonance from the response of resonator 110 may be achieved, although the scope of claimed subject matter is not limited in this respect.

In one or more embodiments, cancellation of an anti-resonance response of resonator 110 with cancellation network 112 may occur in a current domain at node 126 as a result of the outputs of resonator 110 and cancellation network 112 being connected at node 126 coupled to resistor 128. As a result, no load matching is required at the output circuit 100 since cancellation of anti-resonance may occur at a single resistor. Cancellation of anti-resonance may be provided via matching, and/or nearly matching an impedance of cancellation network with an impedance of an inherent component in resonator 110 that creates an anti-resonance effect in a response of resonator 110. As shown in FIG. 2, cancellation network 112 may comprise cancellation capacitor 218 having a value that matches, and/or nearly matches, the capacitance value of static capacitance 210, wherein current flowing through cancellation capacitor 218 has the same magnitude, or nearly the same magnitude, as current flowing through static capacitance 210, but with an opposite polarity, such that the two currents may cancel, and/or nearly cancel, when combined at node 126, although the scope of the claimed subject matter is not limited in this respect.

Referring now to FIG. 3, a diagram of a response of a resonator showing resonance and anti-resonance in accordance with one or more embodiments will be discussed. As shown in FIG. 3, transfer function 310 of resonator 110 may be plotted as admittance (Y), for example in units of siemens, versus frequency (f), for example in units of hertz. Peak admittance 312 may occur at a resonant frequency, $f_r$, which may correspond to a series resonance characteristic of resonator 110. Minimum admittance 314 may occur at an anti-resonant frequency, $f_a$, which may correspond to a parallel resonance characteristic of resonator 110, and which may be referred to as anti-resonance.

Referring now to FIG. 4, a diagram of a response of a resonator and a cancellation circuit showing a cancellation, at least in part, of anti-resonance in accordance with one or more embodiments will be discussed. As shown in FIG. 4, transfer function 410 of resonator 112 and cancellation network 112 in combination may be plotted as admittance (Y), for example in units of siemens, versus frequency (f), for example plotted in units of hertz. Peak admittance 412 may occur at a resonant frequency, $f_r$, where cancellation network 112 may reduce at least in part and/or remove an anti-resonance effect as shown in FIG. 4. Cancellation of anti-resonance with cancellation network 112 may result in circuit 100 having a more ideal bandpass filter response with a relatively higher Q factor and center frequency at or near frequency $f_r$ as shown in FIG. 4, although the scope of the claimed subject matter is not limited in this respect.

Figure 5:
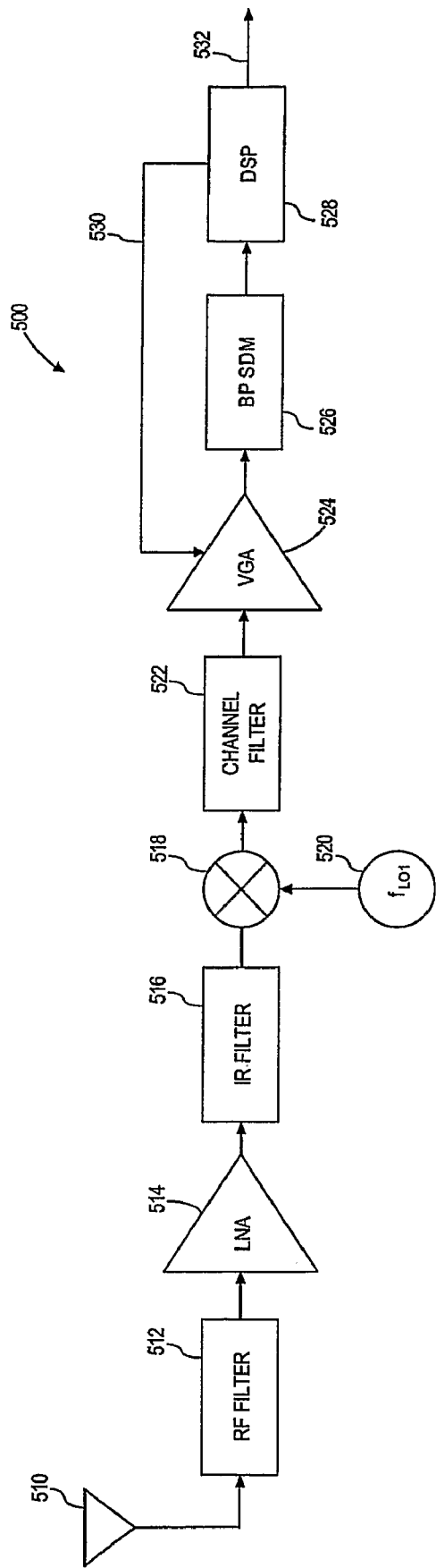
FIG. 5 is a block diagram of an intermediate-frequency (IF) digitization receiver including a narrowband bandpass sigma-delta modulator that may utilize a resonator and a cancellation network in accordance with one or more embodiments.

Referring now to FIG. 5, a block diagram of a an intermediate-frequency (IF) digitization receiver including a bandpass sigma-delta modulator that may utilize a resonator and a cancellation network in accordance with one or more embodiments will be discussed. Receiver 500 may be a radio-frequency (RF) receiver utilized, for example, in a cellular telephone type device, a wireless local area network (WLAN) type device, and/or the like. An RF signal may be received via antenna 510, filtered with RF filter 512, and amplified with low-noise amplifier (LNA) 514. The signal may then be passed through image-rejection (IR) filter (IR FILTER) 516 where the signal may be demodulated using demodulator 518 and oscillator ($f_{LO1}$) 520. A channel may be selected by passing the signal through channel filter (CHANNEL FILTER) 522 and then amplified via variable gain amplifier (VGA) 524. Digitization of the signal may be accomplished via bandpass sigma-delta modulator (BP SDM) 526 to provide a digitized form of the signal to digital signal processor (DSP) 528 for baseband processing of the signal. DSP 528 may control the gain of VGA 524 via control line 530, and may provide output 532 in response to the received signal, which may be, for example, data contained within the received signal, although the scope of claimed subject matter is not limited in this respect. Bandpass sigma-delta modulator 526 for digitization of the IF signal may be realized using circuit 100 to provide a bandpass filter function, for example using an electromechanical resonator type device for resonator 110, where an anti-resonance characteristic of resonator may be reduced and/or removed via cancellation network 112, although the scope of the claimed subject matter is not limited in this respect.

In one or more embodiments, receiver 500 may be part of a transceiver of a wireless local or personal area network (WLAN or WPAN) communication system. For example, receiver 500 may be utilized in a mobile or remote unit such as a mobile computer and/or information handling system, a desktop computer, and/or a cellular telephone, and digital signal processor 528 may provide baseband and/or media access control (MAC) processing functions. In one embodiment, DSP 528 may comprise a single processor, including filtering, and/or alternatively may also comprise a baseband processor and/or an applications processor, although the scope of the claimed subject matter is not limited in this respect. DSP 528 may couple to a memory (not shown) which may include volatile memory such as DRAM, non-volatile memory such as flash memory, and/or alternatively may include other types of storage such as a hard disk drive, although the scope of the claimed subject matter is not limited in this respect. Some portion or all of the memory may be included on the same integrated circuit DSP 528, and/or alternatively some portion and/or all of the memory may be disposed on an integrated circuit and/or other medium, for example a hard disk drive, that is external to the integrated circuit of DSP 528, although the scope of the claimed subject matter is not limited in this respect.

Receiver 500 may receive signals via antenna 510 that are received, for example from a remote access point and/or base station (not shown) via wireless communication link. In an alternative embodiment, receiver 500 may include two or more of antennas 510, for example to provide a spatial division multiple access (SDMA) system and/or a multiple input, multiple output (MIMO) system, although the scope of the invention is not limited in this respect. The remote access point may couple with network so that receiver may receive information from the network, including devices coupled to the network, by communicating via the wireless communication link. Such a network may include a public network such as a telephone network and/or the Internet, and/or alternatively the network may include a private network such as an intranet, and/or a combination of a public and/or a private network, although the scope of the claimed subject matter is not limited in this respect. Communication between receiver 500 and the remote access point may be implemented via a wireless personal area networks (WPAN) such as a network in compliance with the WiMedia Alliance, a wireless local area network (WLAN), for example a network compliant with a an Institute of Electrical and Electronics Engineers (IEEE) standard such as IEEE 802.11a, IEEE 802.11b, IEEE 802.11n, IEEE 802.16, HiperLAN-II, HiperMAN, Ultra-Wideband (UWB), and so on, although the scope of the claimed subject matter is not limited in this respect. In another embodiment, such communication between may be at least partially implemented via a cellular communication network compliant with a Third Generation Partnership Project (3GPP or 3G) standard, a Wideband CDMA (WCDMA) standard, and so on, although the scope of the claimed subject matter is not limited in this respect.

Figure 6:
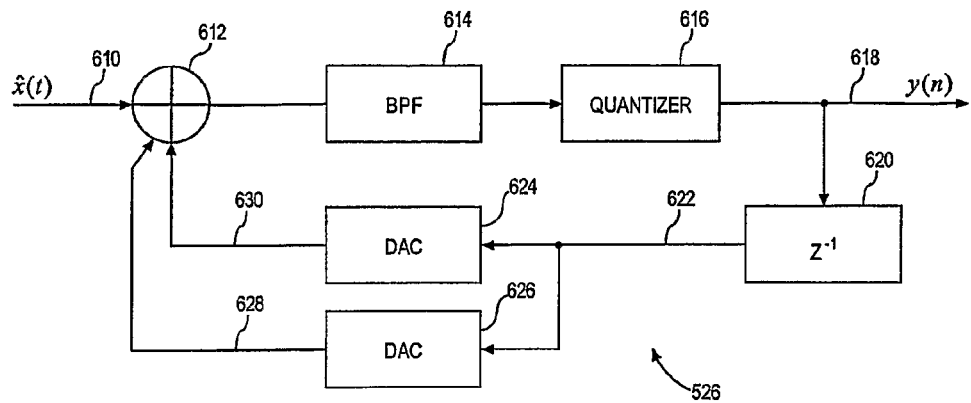
FIG. 6 is a block diagram of a second order bandpass sigma-delta modulator that may utilize a resonator and a cancellation network in accordance with one or more embodiments.

Referring now to FIG. 6, a block diagram of a second order bandpass sigma-delta modulator that may utilize a resonator and a cancellation network in accordance with one or more embodiments will be discussed. Bandpass sigma-delta modulator 526 as shown in FIG. 6 may be a second order bandpass sigma-delta modulator and may be utilized, for example, as bandpass sigma-delta modulator 526 of receiver 500 of FIG. 5, although the scope of the claimed subject matter is not limited in this respect. Although bandpass sigma-delta modulator 526 of FIG. 6 is shown as a second order modulator, other orders may be within the scope of the claimed subject matter, for example first order, third order, fourth order, and so on, and the scope of the claimed subject matter is not limited in this respect. A continuous time signal $\hat{x}(t)$, such as an IF signal of receiver 500, may be applied to summer 612, the output of which may be applied to bandpass filter function 614 that may be provided by circuit 100 via resonator 110 in combination with cancellation network 112. The output of circuit 100 maybe applied to quantizer 616 to provide a discrete time version y(n) of the continuous time signal at output 618. Output 618 may be fed back through delay function 620 to provide a delayed output 622 to digital-to-analog converter (DAC) 624 and to DAC 626. DAC 624 may provide a return-to-zero (RZ) signal, and DAC 626 may provide a half-delayed return-to-zero (HRZ) signal. Delay for one sampling period may be provided by discrete time delay function 620, for example, to avoid metastability and to provide sufficient time for quantizer 616 to settle. Although FIG. 6 only describes a second-order sigma-delta modulator with a single-bit quantizer, higher-order multi-bit sigma-modulator may be realized in a similar arrangement.

Figure 7:
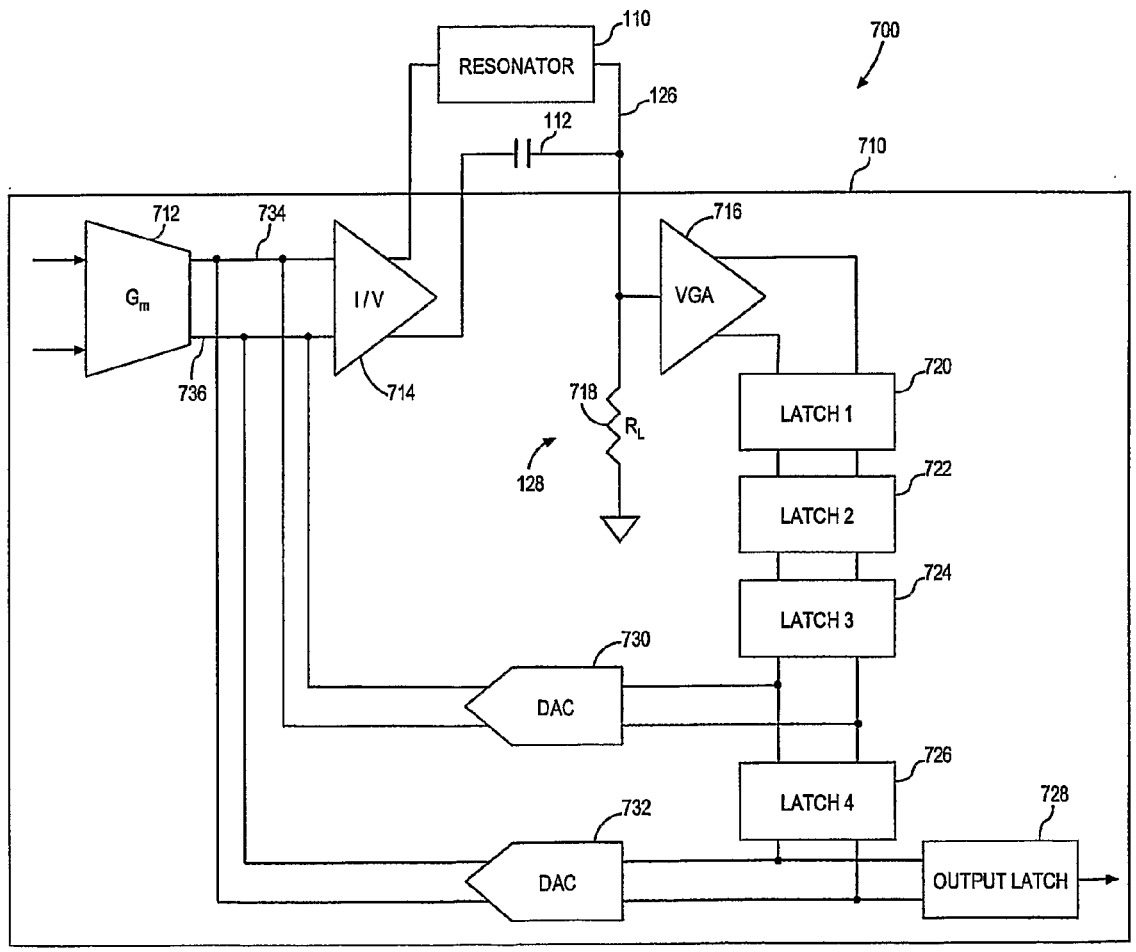
FIG. 7 is a circuit level structural diagram of a bandpass sigma-delta modulator in accordance with one or more embodiments.

Referring now to FIG. 7, a circuit level structural diagram of a bandpass sigma-delta modulator in accordance with one or more embodiments will be discussed. Bandpass sigma-delta modulator 700 may be substantially similar to bandpass sigma-delta modulator 526 of FIG. 5 and FIG. 6, with functional blocks being implemented with circuit blocks and/or elements. At least some circuit components of bandpass sigma-delta modulator 700 may be realized on a semiconductor chip 710 fabricated, for example, using a standard CMOS process. Input transconductor ($G_m$) 712 may be utilized to convert an input signal from voltage to current, for example so that summation with the feedback signals received from DAC 730 and/or DAC 732 may be performed in the current domain at nodes 734 and 736. After summation, the current signals may be converted back to voltage by a current-to-voltage converter (I/V) 714, for example to drive resonator 110 and/or cancellation network 112 which may be disposed off of chip 710 or on chip 710. The outputs of resonator 110 and cancellation network 112 may be combined at node 126 and applied to ground through resistor $R_L$ 718 to provide an input signal to variable gain amplifier (VGA) 716. Alternatively, resistor $R_L$ 718 and variable gain amplifier (VGA) 716 may be replaced by a transimpedance amplifier. VGA 716 may also be utilized, for example, to provide phase regulation or compensation of the signal prior to quantization. Phase regulation or compensation may also be realized by a separate phase regulator following variable gain amplifier (VGA) or transimpedance amplifier and before the quantization. Since VGA 716 may present a relative higher input impedance, resistor 718 may be the effective load seen at node 126 and may be analogous to load 128 of FIG. 1, although the scope of claimed subject matter is not limited in this respect.

Quantization by quantizer 616 and delay function 620 of FIG. 6 may be realized with four serially connected dynamic latches, latch (LATCH 1) 720, latch (LATCH 2) 722, latch (LATCH 3) 724, and latch (LATCH 4) 726. Latch 720 may function as quantizer 616, for example to provide one-bit quantization. Latch 722, together with latch 720, may function as delay function 620 to provide one sampling period delay. In an alternative arrangement, Latch 720 and latch 722 may be replaced by a comparator or one-bit quantizer that has one sampling period delay. Latch 724 and latch 726 may generate RZ and control signals for DAC 730, and latch 724 may generate HRZ control signals for DAC 732. DAC 730 and/or DAC 732 may be current-switched digital-to-analog converters to provide current summation at node 734 and node 736. In one or more embodiments, the circuit of latch 720 may be arranged to reduce kickback noise. Bandpass sigma-delta modulator 700 may provide a digital output via latch (OUTPUT LATCH) 728, which may be, for example, a D flip-flop, although the scope of the claimed subject matter is not limited in this respect.

Referring now to FIG. 8, a block diagram of an intermediate-frequency (IF) digitization receiver including a wideband bandpass sigma-delta modulator that may utilize a resonator and a cancellation network in accordance with one or more embodiments will be discussed. Receiver 800 illustrates one possible embodiment of a system that may utilize bandpass sigma-delta modulator 526 that utilizes resonator 110 and cancellation network 112 to cancel anti-resonance from the response of resonator 110 in accordance with one or more embodiments. Receiver 800 of FIG. 8 may be substantially similar to receiver 500 of FIG. 5 with the exception of including a wideband bandpass sigma-delta modulator 526 to digitize a wider signal band, for example the whole signal band, rather than a single channel. Blocks of FIG. 8 that are similar to blocks of FIG. 5 may perform a similar function in some embodiments. Antenna 810 may receive an RF signal that may be filtered with RF filter 812 and then amplified with LNA 814. The amplified RF signal may then be filtered via IF filter 816 and demodulated using demodulator 818 and oscillator 820. A wideband demodulated output may be provided to bandpass sigma-delta modulator 526 for analog-to-digital conversion of the wideband signal. The digitized wideband signal may be provided to DSP 822 for further digital signal processing, such as filtering and baseband signal processing, to provide an output 824, although the scope of the claimed subject matter is not limited in this respect.

Referring now to FIG. 9, a block diagram of a radio-frequency (RF) digitization receiver including an RF wideband bandpass sigma-delta modulator that may utilize a resonator and cancellation network in accordance with one or more embodiments will be discussed. Receiver 900 illustrates one possible embodiment of a system that may utilize bandpass sigma-delta modulator 526 that utilizes resonator 110 and cancellation network 112 to cancel anti-resonance from the response of resonator 110 in accordance with one or more embodiments. Blocks of FIG. 9 that are similar to blocks of FIG. 5 may perform a similar function in some embodiments. In accordance with one or more embodiments, receiver 900 of FIG. 9 may implement RF digitization of a received RF signal. The RF signal may be received via antenna 910, filtered via RF filter 912, and amplified via LNA 914. The amplified RF signal may be directly digitized via bandpass sigma-delta modulator 526 for analog-to-digital conversion of the RF signal. In such an embodiment, resonator 110 may have a resonant frequency tuned to the RF signal wherein resonant frequency of resonator 110 may correspond to a frequency or frequency band of the RF signal. The digitized RF signal may then be provided to DSP 916 for further digital signal processing, such as filtering and baseband signal processing, to provide output 918, although the scope of the claimed subject matter is not limited in this respect. Narrow band IF digitization receiver 500 of FIG. 5, wideband IF digitization receiver 800 of FIG. 8, and/or RF digitization receiver 900 of FIG. 9 illustrate example systems where circuit 100 including resonator 110 and cancellation network may be utilized for cancellation of anti-resonance from resonator 110. However, these are merely examples of applications for circuit 100. Other applications for circuit 100 are contemplated as being within the scope of the claimed subject matter, and the scope of the claimed subject matter is not limited in this respect.

Although the claimed subject matter has been described with a certain degree of particularity, it should be recognized that elements thereof may be altered by persons skilled in the art without departing from the spirit and/or scope of the claimed subject matter. It is believed that cancellation of anti-resonance in resonators and/or many of its attendant advantages will be understood by the forgoing description, and it will be apparent that various changes may be made in the form, construction and/or arrangement of the components thereof without departing from the scope and/or spirit of the claimed subject matter or without sacrificing all of its material advantages, the form herein before described being merely an explanatory embodiment thereof, and/or further without providing substantial change thereto. It is the intention of the claims to encompass and/or include such changes.

What is claimed is:

1. An apparatus, comprising:
  a resonator disposed at a first side of a node, and including an output coupled with the node;
  a cancellation network disposed at the first side of the node, and including an output coupled with the node; and
  a resistor disposed at a branch path off a main path, at a second side of the node, and coupled with the node;
  wherein the first side and the second side are opposite sides;
  wherein the cancellation network and the resistor are configured to cooperate to reduce an anti-resonance characteristic of a response of said resonator via near cancellation of a response of a static capacitance of said resonator at the node.

2. The apparatus as claimed in claim 1, wherein said cancellation network comprises a capacitor having a value at least nearly matching the static capacitance of said resonator.

3. The apparatus as claimed in claim 1, further comprising an amplifier having a non-inverting output and an inverting output, said resonator to couple to one of the non-inverting output and the inverting output, and said cancellation network to couple to another one of the non-inverting output and the inverting output.

4. The apparatus as claimed in claim 1, wherein said resonator comprises at least one of a surface acoustic wave type resonator, a bulk acoustic wave type resonator, a film bulk acoustic resonator type resonator, a crystal type resonator, a ceramic type resonator, a micro-electromechanical system type resonator, and/or an electromechanical type resonator.

5. The apparatus as claimed in claim 1, wherein the cancellation network comprises a diode.

6. An apparatus, comprising:
  a bandpass filter;
  a quantizer to receive an output of said bandpass filter; and
  two digital-to-analog converters to feedback an output of said quantizer to an input of said bandpass filter;
  wherein said bandpass filter comprises a resonator disposed at a first side of a node, and includes an output coupled with the node, a cancellation network disposed at the first side of the node, and includes an output coupled with the node; and a resistor disposed at a branch path off a main path, at a second side of the node, and coupled with the node; wherein the first side and the second side are opposite sides; wherein the cancellation network and the resistor are configured to cooperate to reduce an anti-resonance characteristic of a response of said resonator via near cancellation of a response of static capacitance of said resonator at the node.

7. The apparatus as claimed in claim 6, wherein said cancellation network comprises a capacitor having a value at least nearly matching the static capacitance of said resonator.

8. The apparatus as claimed in claim 6, further comprising an amplifier having a non-inverting output and an inverting output, said resonator to couple to one of the non-inverting output and the inverting output, and said cancellation network to couple to another one of the non-inverting output and the inverting output.

9. The apparatus as claimed in claim 6, wherein said resonator comprises at least one of a surface acoustic wave type resonator, a bulk acoustic wave type resonator, a film bulk acoustic resonator type resonator, a crystal type resonator, a ceramic type resonator, a micro-electromechanical system type resonator, and/or an electromechanical type resonator.

10. The apparatus as claimed in claim 6, wherein the cancellation network comprises a diode.

11. The apparatus as claimed in claim 6, further comprising a delay circuit coupled between the output of said quantizer and inputs of said digital-to-analog converters, to feedback the output of said quantizer received via said delay circuit to the input of said bandpass filter.

12. An apparatus, comprising:
  a radio-frequency circuit to demodulate a received radio-frequency signal; and
  a bandpass sigma-delta modulator to convert the demodulated signal into a digital signal, said bandpass sigma-delta modulator comprising a bandpass filter, a quantizer to receive an output of said bandpass filter, and a digital-to-analog converter to feedback an output of said quantizer to an input of said bandpass filter;
  wherein said bandpass filter comprises a resonator disposed at a first side of a node, and includes an output coupled with the nodes; a cancellation network disposed at the first side of the node, and includes an output coupled with the node; and a resistor disposed at a branch path, off a main path, at a second side of the node, and coupled with the node; wherein the first side and the second side are opposite sides; wherein the cancellation network and resistor are configured to cooperate to reduce an anti-resonance characteristic of a response of said resonator via near cancellation of a response of static capacitance of said resonator at the node.

13. The apparatus as claimed in claim 12, wherein said cancellation network comprises a capacitor having a value at least nearly matching the static capacitance of said resonator.

14. The apparatus as claimed in claim 12, further comprising an amplifier having a non-inverting output and an inverting output, said resonator to couple to one of the non-inverting output and the inverting output, and said cancellation network to couple to another one of the non-inverting output and the inverting output.

15. The apparatus as claimed in claim 12, wherein said resonator comprises at least one of a surface acoustic wave type resonator, a bulk acoustic wave type resonator, a film bulk acoustic resonator type resonator, a crystal type resonator, a ceramic type resonator, a micro-electromechanical system type resonator, and/or an electromechanical type resonator.

16. The apparatus as claimed in claim 12, wherein the cancellation network comprises a diode.

17. The apparatus as claimed in claim 12, further comprising a delay circuit coupled between the output of said quantizer and input of said digital-to-analog converter, and an additional digital-to-analog converter to feedback the output of said quantizer received via said delay circuit to the input of said bandpass filter.

18. The apparatus as claimed in claim 12, said bandpass sigma-delta modulator having a narrowband response.

19. The apparatus as claimed in claim 12, said bandpass sigma-delta modulator having a wideband response.

20. An apparatus, comprising: means for providing a resonance response, said means for providing a resonance response including an output disposed at a first side of a node, and coupled with the node; and means for canceling an anti-resonance, said means for cancelling an anti-resonance including a cancellation network with an output disposed at the first side of the node, and coupled with the node, and a resistor disposed at a branch path, off a main path, at a second side of the node, and coupled with the node;

wherein the first side and the second side are opposite sides, and said cancellation network and the resistor are configured to cooperate to reduce an anti-resonance characteristic of a response of said means for providing a resonance response via near cancellation of a response of static capacitance of said means for providing a resonance response at the node.

21. The apparatus as claimed in claim 20, wherein said means for cancelling an anti-resonance further includes means for storing an electric charge, said means for storing an electric charge having a capacitance value at least nearly matching a static capacitance of said means for providing a resonance response.

22. The apparatus as claimed in claim 20, further comprising means for amplifying a signal, said means for amplifying a signal including a non-inverting output and an inverting output, said means for providing a resonance response to couple to one of the non-inverting output and the inverting output, and said means for cancelling an anti-resonance to couple to another one of the non-inverting output and the inverting output.

23. The apparatus as claimed in claim 20, wherein said means for providing a resonance response comprises at least one of a surface acoustic wave type resonator, a bulk acoustic wave type resonator, a film bulk acoustic resonator type resonator, a crystal type resonator, a ceramic type resonator, a micro-electromechanical system type resonator, and/or an electromechanical type resonator.

24. The apparatus as claimed in claim 20, wherein the cancellation network comprises a diode.

25. An apparatus, comprising:
means for providing a bandpass filter response;
means for quantizing a signal, said means for quantizing a signal to receive an output of said means for providing a bandpass filter response; and
means for converting a digital signal to an analog signal, said means for converting a digital signal to an analog signal to feedback an output of said means for quantizing a signal to an input of said means for providing a bandpass filter response;
wherein said means for providing a bandpass filter response comprises;
means for providing a resonance response including an output disposed at a first side of a node, and coupled with the node;
means for canceling an anti-resonance including a cancellation network with an output disposed at the first side of the node, and coupled with the node; and a resistor disposed at a branch path, off a main path, at a second side of the node and coupled with the node;
wherein said first side and said second side are opposite sides, and
wherein said cancellation network and the resistor are configured to cooperate to reduce an anti-resonance characteristic of a response of said means for providing a resonance response via near cancellation of a response of static capacitance of said means for providing a resonance response at the node.

26. The apparatus as claimed in claim 25, wherein said means for cancelling an anti-resonance further includes a capacitor having a value at least nearly matching the static capacitance of said means for providing a resonance response.

27. The apparatus as claimed in claim 25, further comprising means for amplifing a signal having a non-inverting output and an inverting output, said means for providing a resonance response to couple to one of the non-inverting output and the inverting output, and said means for cancelling an anti-resonance to couple to another one of the non-inverting output and the inverting output.

28. The apparatus as claimed in claim 25, wherein said means for providing a resonance response comprises at least one of a surface acoustic wave type resonator, a bulk acoustic wave type resonator, a film bulk acoustic resonator type resonator, a crystal type resonator, a ceramic type resonator, a micro-electromechanical system type resonator, and/or an electromechanical type resonator.

29. The apparatus as claimed in claim 25, wherein the cancellation network comprises a diode.

30. The apparatus as claimed in claim 25, further comprising means for providing a delay coupled between the output of said means for quantizing a signal and input of said means for converting a digital signal to an analog signal, and an additional means for converting a digital signal to an analog signal to feedback the output of said means for quantizing a signal received via said means for providing a delay to the input of said means for providing a bandpass filter response.

31. An apparatus, comprising:
means for demodulating a received radio-frequency signal; and
means for converting the demodulated signal from an analog signal into a digital signal, said means for converting an analog signal to a digital signal comprising:
means for providing a bandpass filter response;
means for quantizing a signal, said means for quantizing a signal to receive an output of said means for providing a bandpass filter response; and
means for converting a digital signal to an analog signal, said means for converting a digital signal to an analog signal to feedback an output of said means for quantizing a signal to an input of said means for providing a bandpass filter response;
wherein said means for providing bandpass filter response comprises:
means for providing a resonance response having an output disposed at a first side of a node, and coupled with the node;
means for canceling an anti-resonance including a cancellation network with an output disposed at the first side of the node, and coupled with the node; and
a resistor disposed at a branch path off a main path, at a second side of the node, and coupled with the node;
wherein said first side and said second side are opposite sides;

wherein said cancellation network and said resistor are configured to reduce an antiresonance characteristic of a response of said means for providing a resonance response via near cancellation of a response of static capacitance of said means for providing a resonance response at the node.

32. The apparatus as claimed in claim 31, wherein said means for cancelling an anti-resonance further includes a capacitor having a value at least nearly matching the static capacitance of said means for providing a resonance response.

33. The apparatus as claimed in claim 31, further comprising an amplifier having a non-inverting output and an inverting output, said means for providing a resonance response to couple to one of the non-inverting output and the inverting output, and said means for cancelling an anti-resonance to couple to another one of the non-inverting output and the inverting output.

34. The apparatus as claimed in claim 31, wherein said means for providing a resonance response comprises at least one of a surface acoustic wave type resonator, a bulk acoustic wave type resonator, a film bulk acoustic resonator type resonator, a crystal type resonator, a ceramic type resonator, a micro-electromechanical system type resonator, and/or an electromechanical type resonator.

35. The apparatus as claimed in claim 31, wherein the cancellation network comprises a diode.

36. The apparatus as claimed in claim 31, further comprising means for providing a delay coupled between the output of said means for quantizing a signal and an input of said means for converting a digital signal to an analog signal, and an additional means for converting a digital signal to an analog signal to feedback the output of said means for quantizing a signal received via said means for providing a delay to the input of said means for providing a bandpass filter response.

37. The apparatus as claimed in claim 31, said means for converting an analog signal to a digital signal having a narrowband response.

38. The apparatus as claimed in claim 31, said means for converting an analog signal to a digital signal having a wideband response.

39. A method, comprising:
driving a first current through a resonator with a response by static capacitance of the resonator;
driving a second current through a cancellation network with negative capacitance relative to the static capacitance of the resonator, the second current having an opposite polarity from the first current;
combining the first current and the second current at a node, after the first current and the second current have been driven through the resonator and the cancellation network respectively; and
applying the combined current to a load disposed at a branch path off a main path, and coupled with the node, opposite to the resonator and the cancellation network;
wherein said combining, by virtue of cooperation between the cancellation network and the load, results in a reduction of an anti-resonance characteristic of a response of the resonator, via near cancellation of a response of the static capacitance of the resonator at the node.

40. The method as claimed in claim 39, wherein the reduction of the anti-resonance characteristic of the response of the resonator results in a resonance characteristic of the resonator as a predominant characteristic of a transfer function of the resonator.

41. An apparatus, comprising:
a radio-frequency circuit to receive a radio-frequency signal; and
a bandpass sigma-delta modulator to directly convert the radio-frequency signal into a digital signal, said bandpass sigma-delta modulator comprising a bandpass filter, a quantizer to receive an output of said bandpass filter, and a digital-to-analog converter to feedback an output of said quantizer to an input of said bandpass filter;
wherein said bandpass filter comprises a resonator disposed at a first side of a node, and includes an output coupled with the node; a cancellation network disposed at the first side of the node, and includes an output coupled with the node; a resistor disposed at a branch path off a main path, at a second side of the node, and coupled with the node; wherein the cancellation network and the resistor are configured to cooperate to reduce an anti-resonance characteristic of a response of said resonator via near cancellation of a response of static capacitance of the resonator at the node.

42. The apparatus as claimed in claim 41, said bandpass sigma-delta modulator to directly convert the radio-frequency signal into a digital signal prior to further digital signal processing, including at least one or more of filtering, demodulation of the radio-frequency signal or baseband signal processing.

43. An apparatus, comprising:
means for receiving a received radio-frequency signal; and
means for directly converting the radio-frequency signal from an analog signal into a digital signal, said means for directly converting the radio-frequency signal from an analog signal to digital signal including:
means for providing a bandpass filter response; means for quantizing a signal, said means for quantizing to receive an output of said means for providing a bandpass filter response; and
means for converting a digital signal to an analog signal, said means for converting a digital signal to an analog signal to feedback an output of said means for quantizing a signal to an input of said means for providing a bandpass filter response;
wherein said means for providing a bandpass filter response comprises:
means for providing a resonance response including an output disposed at a first side of a node, and coupled with the node;
means for canceling an anti-resonance including a cancellation network with an output disposed at the first side of the node, and coupled with the node; and
a resistor disposed at a branch path off a main path, at a second side of the node, and coupled with the node;
wherein said first side and second side are opposite sides;
wherein said cancellation circuit and said resistor are configured to cooperate to reduce an anti-resonance characteristic of a response of said means for providing a resonance response, via near cancellation of a response of static capacitance of said means for providing a resonance response, at the node.

44. The apparatus as claimed in claim 43, said means for converting an analog signal to digital signal to directly convert the radio-frequency signal into a digital signal prior to further digital signal processing, including at least one or more of filtering, demodulation of the radio-frequency signal or baseband signal processing.

* * * * *

UNITED STATES PATENT AND TRADEMARK OFFICE
CERTIFICATE OF CORRECTION

| | | |
|---|---|---|
| PATENT NO. | : 7,965,157 B2 | Page 1 of 1 |
| APPLICATION NO. | : 11/996252 | |
| DATED | : June 21, 2011 | |
| INVENTOR(S) | : Xu et al. | |

It is certified that error appears in the above-identified patent and that said Letters Patent is hereby corrected as shown below:

Title page, item (57), under "Abstract", in Column 2, Line 6, delete "anti resonance" and insert -- anti-resonance --.

Column 10, line 46, in Claim 12, delete "nodes;" and insert -- node; --.

Column 11, line 64, in Claim 25, delete "comprises;" and insert -- comprises: --.

Column 12, line 20, in Claim 27, delete "amplifing" and insert -- amplifying --.

Column 12, line 58, in Claim 31, delete "having" and insert -- including --.

Column 13, line 2, in Claim 31, delete "antiresonance" and insert -- anti-resonance --.

Column 13, line 16, in Claim 33, delete "saidmeans" and insert -- said means --.

Signed and Sealed this
Eighteenth Day of October, 2011

David J. Kappos
*Director of the United States Patent and Trademark Office*